United States Patent
Zimmerman et al.

(10) Patent No.: US 7,579,285 B2
(45) Date of Patent: Aug. 25, 2009

(54) ATOMIC LAYER DEPOSITION METHOD FOR DEPOSITING A LAYER

(75) Inventors: Paul Zimmerman, Leefdaal (BE); Matty Caymax, Leuven (BE); Stefan De Gendt, Wijnegem (BE); Annelies Delabie, Bierbeek (BE); Lars-Ake Ragnarsson, Leuven (BE)

(73) Assignee: IMEC, Kapeldreef (BE)

( * ) Notice: Subject to any disclaimer, the term of this patent is extended or adjusted under 35 U.S.C. 154(b) by 223 days.

(21) Appl. No.: 11/484,229

(22) Filed: Jul. 10, 2006

(65) Prior Publication Data

US 2007/0049045 A1 Mar. 1, 2007

Related U.S. Application Data

(60) Provisional application No. 60/698,331, filed on Jul. 11, 2005.

(51) Int. Cl.
*H01L 21/31* (2006.01)
*H01L 21/469* (2006.01)

(52) U.S. Cl. ............ 438/785; 438/799; 438/681; 257/E21.471; 257/576; 427/255.31

(58) Field of Classification Search .......... 438/785, 438/788, 681, 799, 798; 427/255.31; 257/E21.478, 257/E21.487, E21.471, E21.475, E21.576
See application file for complete search history.

(56) References Cited

U.S. PATENT DOCUMENTS

| | | | |
|---|---|---|---|
| 6,395,650 B1 * | 5/2002 | Callegari et al. ............ 438/785 |
| 2002/0081826 A1 * | 6/2002 | Rotondaro et al. .......... 438/585 |
| 2004/0266217 A1 * | 12/2004 | Kim et al. ................... 438/778 |
| 2005/0074983 A1 * | 4/2005 | Shinriki et al. ............. 438/785 |
| 2005/0087791 A1 * | 4/2005 | Park et al. ................... 257/310 |
| 2005/0175789 A1 * | 8/2005 | Helms, Jr. et al. ............ 427/457 |

* cited by examiner

*Primary Examiner*—Caridad M Everhart
(74) *Attorney, Agent, or Firm*—Knobbe Martens Olson & Bear LLP

(57) ABSTRACT

The invention is related to an ALD method for depositing a layer including the steps of a) providing a semiconductor substrate in a reactor; b) providing a pulse of a first precursor gas into the reactor; c) providing a pulse of a second precursor gas into the reactor; d) providing an inert atmosphere in the reactor; and e) repeating step b) through step d), wherein at least once during step d) the semiconductor substrate is exposed to UV irradiation.

37 Claims, 8 Drawing Sheets

1. λ < 200nm
2. H₂O or H₂O₂

(Temp 0-300°C)

ATOMIC LAYER DEPOSITION METHOD FOR DEPOSITING A LAYER

CROSS-REFERENCE TO RELATED APPLICATIONS

This application claims the benefit under 35 U.S.C. § 119 (e) of U.S. provisional application Ser. No. 60/698,331, filed Jul. 11, 2005, the disclosure of which is hereby incorporated by reference in its entirety and is hereby made a portion of this application.

FIELD OF THE INVENTION

The invention relates to an improved ALD method for depositing layers in the field of semiconductor processing. The invention also relates to a semiconductor device obtainable by a method according to the invention.

BACKGROUND OF THE INVENTION

Because in the field of electronics in general further downscaling of the semiconductor devices is always proceeding, deposition processes have to be developed that are able to deposit layers with a thickness control at atomic layer scale. One of these deposition techniques is Atomic Layer Deposition (ALD), often used for depositing dielectric layers.

In order to achieve satisfying semiconductor device characteristics the interface quality between the semiconductor substrate and the ALD layer has to be controlled sufficiently.

Since for ALD processes the deposition is very temperature sensitive, this control of the interface quality is very challenging.

One of the main reasons why ALD is temperature sensitive is that depending on temperature the semiconductor substrate always has a limited concentration of [OH] (hydroxyls) groups at the surface, which are the active sites for starting the ALD reaction cycle.

Methods have been described intended for preparation of silicon surfaces with a concentration of [OH] at $5 \times 10^{14}$ cm$^{-2}$ before starting the HfCl$_4$ ALD reaction cycle. If each of these reactive sites were utilized one could expect good interface formation. However, data from electrical evaluation of devices with high-k grown with a standard ALD process consequent to these surface preparation methods indicates poor interface quality.

As mentioned above, it is known that the concentration of surface hydroxyls decreases with increasing temperature. Since the semiconductor substrate surface is at a temperature of 300° C. during the conventional ALD deposition the [OH] concentration is limited.

At lower temperature the silicon surface has a significantly higher concentration of surface hydroxyls than under the conventional deposition temperature of 300° C. However, the lower temperature has the negative side effect of not driving the ALD reaction cycle to completion.

SUMMARY OF THE INVENTION

The present invention aims to provide an ALD method to improve the chemical and electrical characteristics of the deposited layer.

An ALD method for depositing a layer is provided, comprising the steps of:

a') providing a semiconductor substrate in a reactor, b') providing a pulse of a first precursor gas into the reactor, c') providing a pulse of a second precursor gas into the reactor, d') providing an inert atmosphere in the reactor, e') repeating at least once step b) through step d), wherein the semiconductor substrate is exposed to UV irradiation at least once during a step (d).

A method according to the present invention can further comprise, between step (a) and step (b), and/or between step (b) and step (c), an additional step of providing an inert atmosphere in the reactor. Preferably, one additional step of providing an inert atmosphere in the reactor is performed between step (b) and step (c).

Said UV irradiation exposure can take place:

during any one of these steps of providing an inert atmosphere in the reactor, or during each step of providing an inert atmosphere in the reactor, or during some (two or more) of these steps of providing an inert atmosphere in the reactor.

In a method according to the invention, said UV irradiation exposure need not be repeated according to step (e), i.e. said UV irradiation exposure can be performed in one single ALD cycle.

Said first precursor gas may be selected from the group consisting of metal halides, metal oxyhalides and metalorganics (also called organometalics), such as hafnium chloride, tantalum chloride, tungsten chloride, zirconium chloride, aluminum chloride, tungsten oxychloride, phosphorous oxychloride, TEMA-Hf (tetrakis-ethyl-methyl-amino-hafnium) or TDEA-Hf (tetrakis-diethyl-amino-hafnium).

The second precursor gas can comprise or consist of a gas selected from the group consisting of $H_2O$, $H_2O_2$, $O_2$, $O_3$, and any precursor suitable for forming oxides or oxynitrides in combination with a first precursor.

Preferably, said second precursor gas comprises or consists of a gas selected from the group consisting of $H_2O$, $H_2O_2$, $O_2$, and $O_3$.

In a method according to the invention, any wavelength having enough irradiation energy to increase the dissociation of the first precursor and increase the formation of hydroxyls (when compared to a method without exposure of the semiconductor substrate to UV irradiation) is envisaged.

Preferably, the wavelength of the UV irradiation is lower than (about) 205 nanometer, or lower than (about) 200 nanometer, preferably lower than (about) 195 nanometer, or lower than (about) 190 nanometer, and more preferably lower than (about) 185 nanometer, or lower than (about) 175 nanometer.

More particularly, the wavelength of the UV irradiation is comprised between (about) 205 nm and (about) 157 nm, preferably between (about) 195 nm and (about) 157 nm, more preferably between (about) 190 nm and (about) 157 nm, even more preferably between (about) 185 nm and (about) 157 nm.

In a method according to the invention, the inert atmosphere may be provided by purging an inert gas into the reactor chamber, such as a noble gas or nitrogen, preferably by purging nitrogen into the reactor chamber.

In a method according to the invention, trace amounts of water, hydrogen peroxide, hydrogen or any other specie suitable for forming hydroxyls in combination with a first and second precursor may be present in the inert atmosphere.

In a method according to the invention, the semiconductor substrate can be exposed to heat (can be heated) during exposure to UV irradiation (i.e. during the UV irradiation treatment).

The temperature may be comprised between room temperature and (about) 350° C., preferably between room temperature and (about) 300° C., more preferably between (about) 100° C. and (about) 250° C., or even more preferably between (about) 150° C. and (about) 220° C.

In a method according to the invention, step a) through d) may be performed at a temperature between (about) 100° C. and (about) 250° C., or preferably between (about) 150° and (about) 220° C.

In a method according to the invention, the exposure to UV irradiation can be stopped after 15 deposition cycles, after 10 deposition cycles, after 5 deposition cycles, after 2 deposition cycles or after 1 deposition cycle.

In a method according to the invention, the semiconductor substrate is preferably exposed up to 15 times, preferably up to 10 times to UV irradiation. Said semiconductor substrate can be exposed only once, or 2, 3, 4 or 5 times.

Said UV irradiation exposure can vary from few seconds (e.g. from about 2 or 3 sec. to about 100 sec.) to few minutes (e.g. between about 2 min. to about 10 min., preferably between about 2 min. and about 5 min, more preferably about 3 min.).

DETAILED DESCRIPTION OF THE PREFERRED EMBODIMENT

Figure 1:
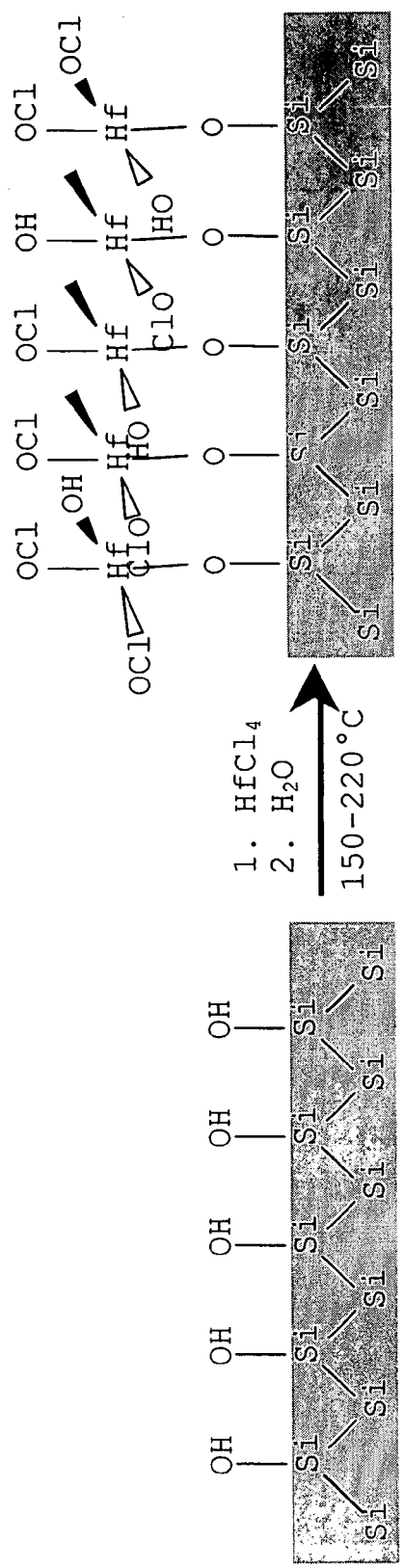
FIG. 1: Result from hafnium chloride reaction with water at low temperatures.

The invention provides an ALD method for depositing a layer comprising the steps of:
a') providing a semiconductor substrate in a reactor,
b') providing a pulse of a first precursor gas into the reactor,
c') providing a pulse of a second precursor gas into the reactor,
d') providing an inert atmosphere in the reactor,
e') repeating step a) through step d), wherein during step d) the semiconductor substrate is exposed to UV irradiation.

More particularly, an ALD method for depositing a layer is provided, comprising the steps of:
a') providing a semiconductor substrate in a reactor,
b') providing a pulse of a first precursor gas into the reactor,
c') providing a pulse of a second precursor gas into the reactor,
d') providing an inert atmosphere in the reactor,
e') repeating at least once step b) through step d), wherein the semiconductor substrate is exposed to UV irradiation at least once, during a step d).

A method according to the present invention can further comprise, between step (a) and step (b), and/or between step (b) and step (c), an additional step of providing an inert atmosphere in the reactor (i.e. an additional step (d)). Preferably, said additional step of providing an inert atmosphere in the reactor is between step (b) and step (c).

Said UV irradiation exposure can take place:
during any one of these steps of providing an inert atmosphere in the reactor, or
during each (and every) step of providing an inert atmosphere in the reactor, or
during some (two, or if possible three or more) of these steps of providing an inert atmosphere in the reactor.

In other words, in a method according to the invention, and within one deposition cycle, step (d) of providing an inert atmosphere in the reactor can be performed at least once (and preferably once) after step (c). But said step of providing an inert atmosphere in the reactor can also be further performed, at least once (and preferably once), between step (a) and step (b), and/or or preferably, at least once (and preferably once), between step (b) and step (c).

The semiconductor substrate is exposed at least once to UV irradiation within a method of the invention, during a step (d).

Said UV irradiation exposure (or treatment) can be done during the first step of providing said inert atmosphere, and/or any of the subsequent step(s) of providing said inert atmosphere.

In the context of the present invention, the term "inert atmosphere" can also be referred to as "inert gas".

In the context of the present invention, the term "deposition cycle" or "ALD cycle" refers to a sequence of steps comprising step (b), step (c), and step (d).

The aspects and advantages of the present invention will become apparent to those of ordinary skill in the art by reading the following detailed description, with reference where appropriate to the accompanying drawings.

The semiconductor substrate can comprise or can consist of any semiconductor material(s) suitable in the field of IC processing, in particular silicon, silicon-on-insulator (SOI), germanium, germanium-on-insulator (GOI), all compound semiconductor substrates, or any combination thereof.

The deposited layer (more particularly the layer to be deposited) may be selected from the group consisting of oxides, such as but not limited to titanium oxide, tantalum oxide, aluminum oxide, zirconium oxide, lanthanum oxide, hafnium oxide, hafnium aluminum oxide, hafnium scandium oxide and hafnium silicon oxide, or any combination thereof.

The layer may also be selected from the group consisting of oxynitrides, such as but not limited to titanium oxynitride, tantalum oxynitride, aluminum oxynitride, zirconium oxynitride, lanthanum oxynitride, hafnium oxynitride, hafnium scandium oxynitride, hafnium silicon oxynitride, or any combination thereof.

The first precursor gas may be selected from the group consisting of metal halides, oxyhalides and metalorganics (also called organometalics), such as hafnium chloride, tantalum chloride, tungsten chloride, zirconium chloride, aluminum chloride, tungsten oxychloride, phosphorous oxychloride, TEMA-Hf (tetrakis-ethyl-methyl-amino-hafnium) or TDEA-Hf (tetrakis-diethyl-amino-hafnium).

The second precursor gas can comprise or consist of a gas be selected from the group consisting of $H_2O$, $H_2O_2$, $O_2$, $O_3$, and any precursor suitable for forming oxides or oxynitrides in combination with a first precursor.

Repeating step b) through step d) may be done as many times as necessary to obtain the layer thickness wanted or required.

In a method according to the invention, any wavelength having enough irradiation energy to increase the dissociation of the first precursor and increase the formation of hydroxyls (compared to any method without exposure of the semiconductor substrate to UV irradiation) is envisaged. Since energy of irradiation increases with decreasing wavelength the shorter the wavelength the better, but this is of course dependent on the availability of suitable UV sources.

In a method according to the invention, the wavelength of the UV irradiation is preferably lower than 205 nanometer, lower than 200 nanometer, lower than 195 nanometer, lower than 190 nanometer, more preferably lower than 185 nanometer, even more preferably lower than 175 nanometer.

More particularly, the wavelength of the UV irradiation is comprised between (about) 205 nm and (about) 157 nm, preferably between (about) 195 nm and (about) 157 nm, more preferably between (about) 190 nm and (about) 157 nm, even more preferably between (about) 185 nm and (about) 157 nm.

In a method according to the invention, the inert atmosphere may be provided by purging an inert gas such as but not limited to nitrogen or argon into the reactor chamber.

In a method according to the invention, trace amounts of water, hydrogen peroxide, hydrogen or any other specie suitable for forming hydroxyls in combination with a first and second precursor may be present in the inert atmosphere.

In a method according to the invention, the semiconductor substrate can be exposed to heat during exposure to UV irradiation.

The temperature may be between room temperature and about 350° C., between room temperature and about 300° C., between about 100° C. and about 250° C., or between about 150° C. and about 220° C.

In a method according to the invention step a) through d) may be performed at a temperature between about 100° C. and about 250° C., or between about 150° C. and about 220° C.

In a method according to the invention, the exposure to UV irradiation is preferably stopped after 10, after 5, after 2 or after 1 deposition cycle(s), depending on the desired deposited layer quality.

The number of deposition cycles including exposure to UV may influence the deposited layer quality.

A method according the invention allows to dramatically improve both chemical and electrical properties of the ALD layer.

Specifically, the density of the layer is increased at the interface between the ALD layer and the semiconductor substrate with the impact of reducing defects at this interface and thus directly improving the layers electrical characteristics.

More specifically, the properties of a dielectric layer on a semiconductor substrate may be optimized and may allow the creation of a layer with superior electrical characteristics including significantly reduced defects in interface states and improved leakage performance.

Furthermore, in some cases; after depositing a layer according to a method of the invention, there is no native oxide re-growth, such as silicon oxide or germanium oxide. Carrying out a method of the invention may actually offer protection towards regrowth during high temperature annealing.

According to a preferred embodiment, a method is provided for depositing a $HfO_2$ layer, comprising the steps of:

a') providing a semiconductor substrate in a reactor, preferably a Si substrate, b') providing a pulse of a $HfCl_4$ gas into the reactor, c') providing a pulse of a $H_2O$ gas into the reactor, d') purging the reactor with a nitrogen gas, e') repeating at least once step (b') through step (d'), wherein the semiconductor substrate is exposed to UV irradiation at least once during a step (d').

In said preferred embodiment, a further nitrogen purge can be performed between step (a') and step (b'), and/or between step (b') and step (c').

Preferably, one further nitrogen purge is done between step (b') and step (c').

Said UV irradiation exposure (or treatment) can be performed during any of the nitrogen purges, or during each and every one of them, or during any two of them.

Said UV irradiation exposure need not be repeated according to step (e'), i.e. said UV irradiation exposure can be performed in one single ALD cycle.

For said preferred embodiment, all the features mentioned for the invention described in its broadest embodiments are also envisaged, where the case may be.

EXAMPLES

Example 1

As a first example of the invention, the ALD of hafnium chloride is performed at lower temperatures (than usually performed), in the range of 150° C.-220° C. (FIG. 1).

At these temperatures, the Si surface has a significantly higher concentration of surface hydroxyls than under the conventional deposition temperature of 300° C.

However, the lower temperature has the negative side effect of not driving the $HfCl_4$ reaction to completion.

The resulting species has some concentration of —OCl termination of the Hf instead of the more desirable —OH termination.

So, although the growth rate of the ALD can be nearly a monolayer (~0.2 nm) per cycle, the defects introduced by the OCl terminations will make for a poor quality layer.

Additionally, it is difficult to remove the residual Cl out of the layers through post deposition anneals.

Figure 2:
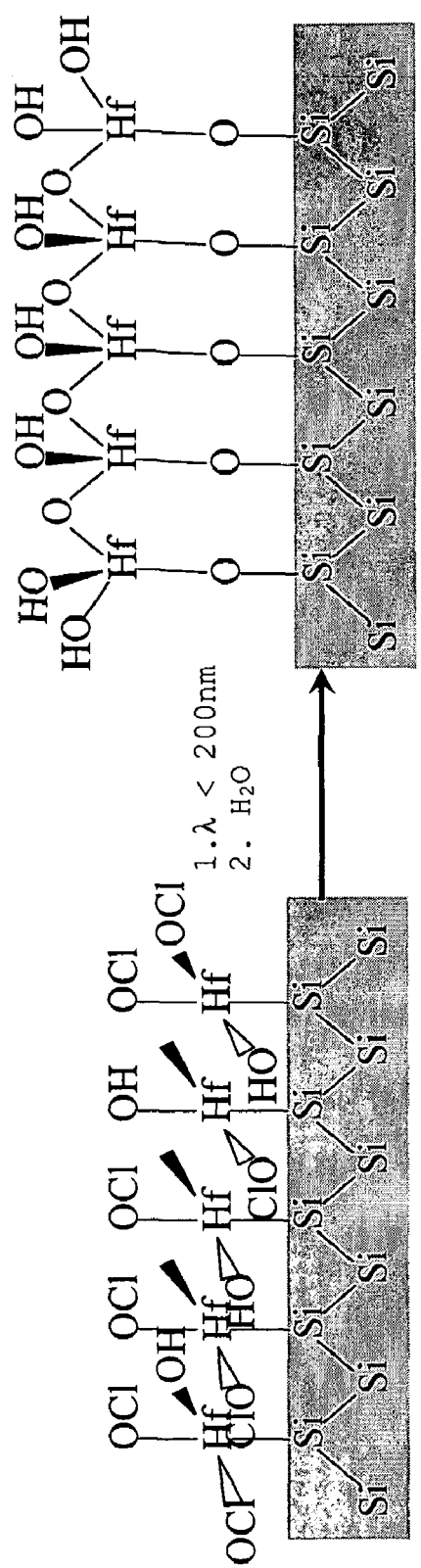
FIG. 2: Result of exposure of initial treated ALD surface with UV for low temperature ALD.

When treating (exposing) the semiconductor substrate with UV in the first one to five cycles, dissociation of $HfCl_4$ is increased and Cl is driven off, thereby leaving a $HfO_2$ lattice terminated by OH groups. FIG. 2 shows the reaction scheme.

The UV irradiation of the surface are performed with wavelengths shorter that 200 nm.

The preferred wavelength is about 185 nm, but 193 nm may also suffice.

The atmosphere is controlled so that the irradiation takes place in $N_2$ or noble gas atmosphere with trace amounts of water or hydrogen peroxide present, so as to drive the reaction to completion giving an OH termination of all available Hf sites.

Additionally heat is added to optimize the reaction during irradiation with UV light. The temperature range is optimized between 100° C. and 300° C.

Organic species have to be carefully excluded from the system, as this will introduce significant contamination to the deposited layer.

After this initial layer has been formed the ALD growth process can be continued at 300° C. with alternating $HfCl_4$ and $H_2O$ water pulses.

Example 2

As a second example of the invention, the ALD starts with the conventional process at 300° C. but in this case the Si surface looks significantly different.

Figure 3:
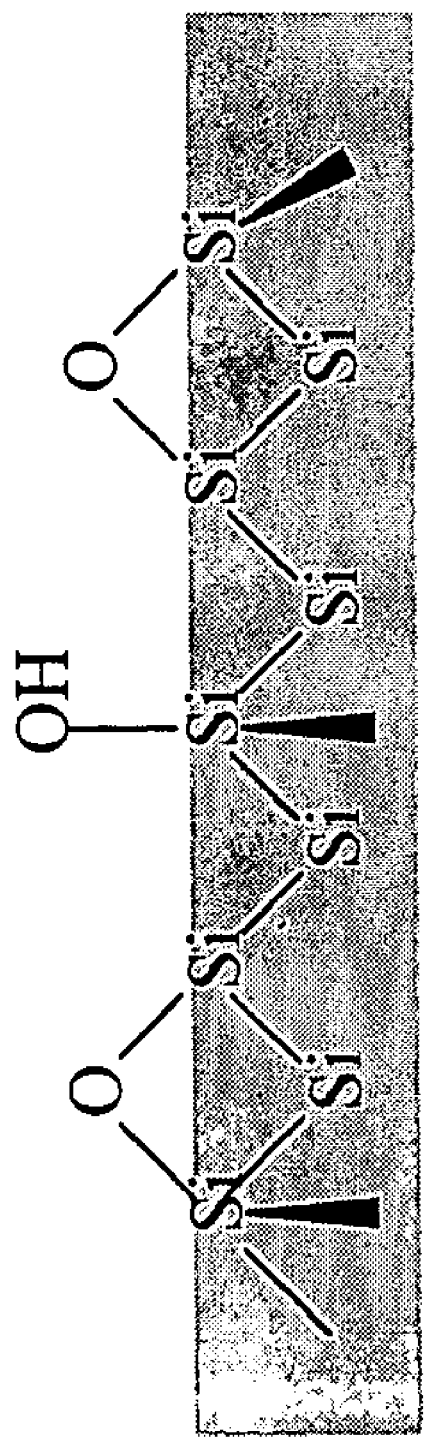
FIG. 3: Projected silicon surface structure at 300° C.

FIG. 3 shows a schematic of the Si surface at 300° C. One can clearly see the difference compared to the starting surface in FIG. 1.

Figure 4:
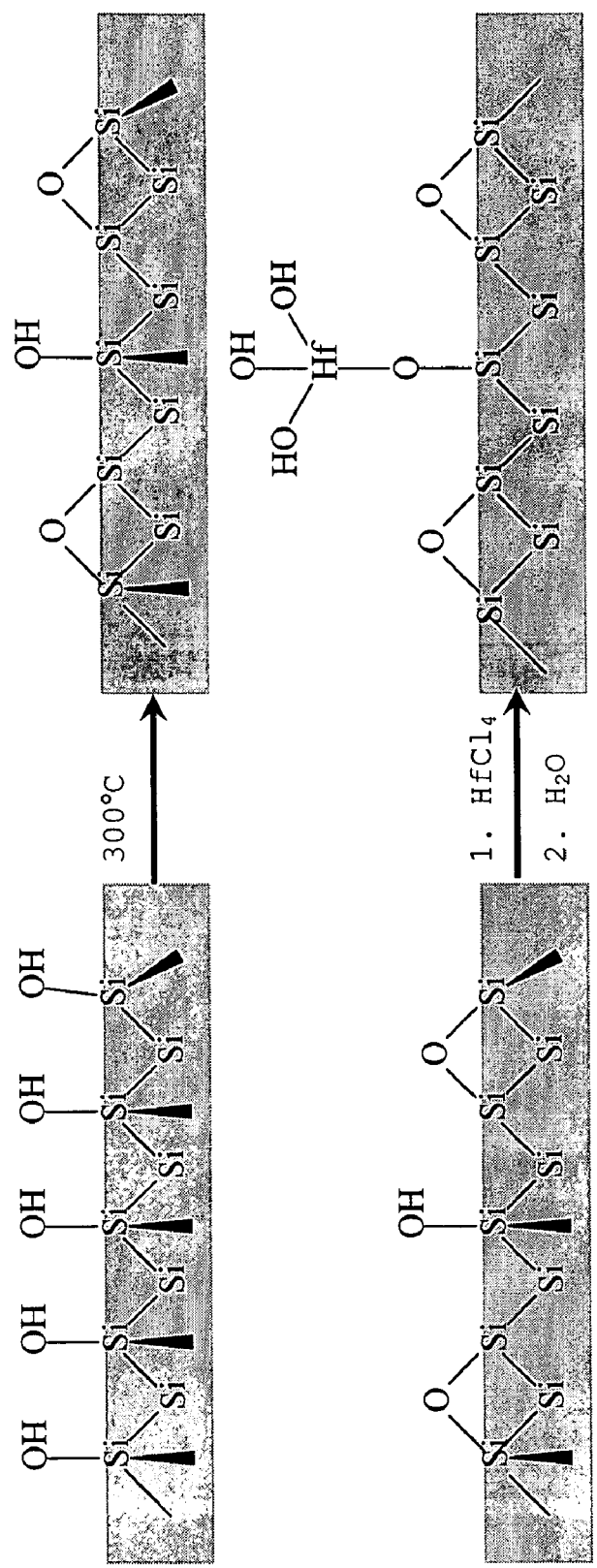
FIG. 4: Reaction scheme for ALD deposition of hafnium chloride and water on silicon oxide at 300° C.

With this high temperature, adjacent hydroxyls react as shown in FIG. 4, leaving few isolated OH groups.

This dramatically reduces the surface coverage in the first few cycles of the ALD process.

Figure 5A:
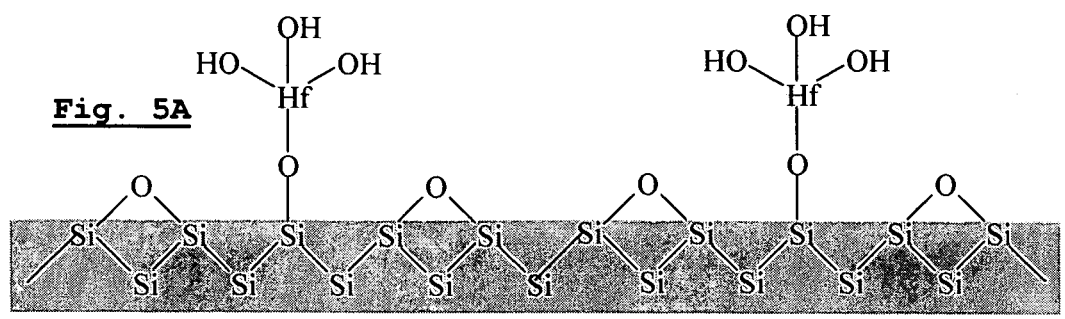
FIG. 5: 5A-5C shows possible starting surface composition following 1-3 cycles of hafnium chloride and water at 300° C. 5D shows the result after the UV treatment.
Figure 5B:
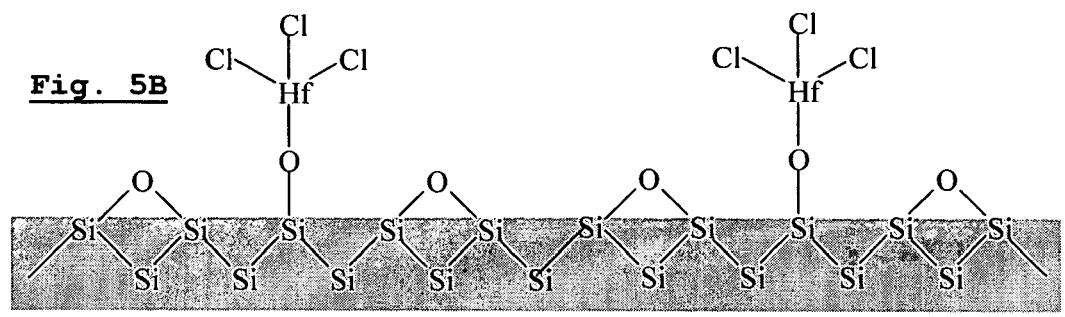
Figure 5C:
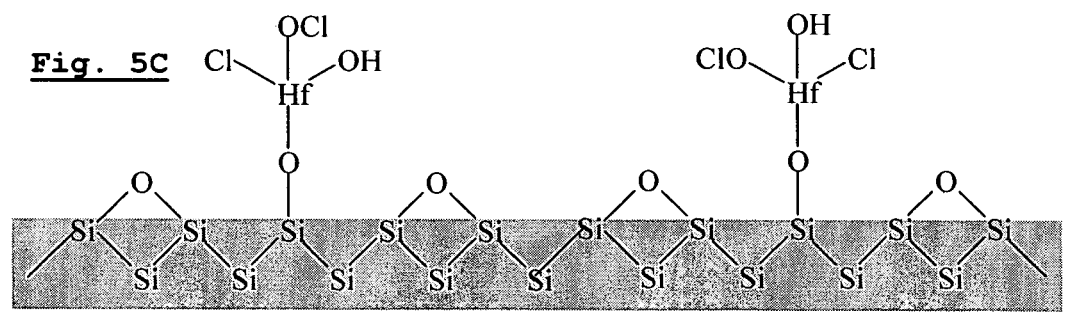
Figure 5D:
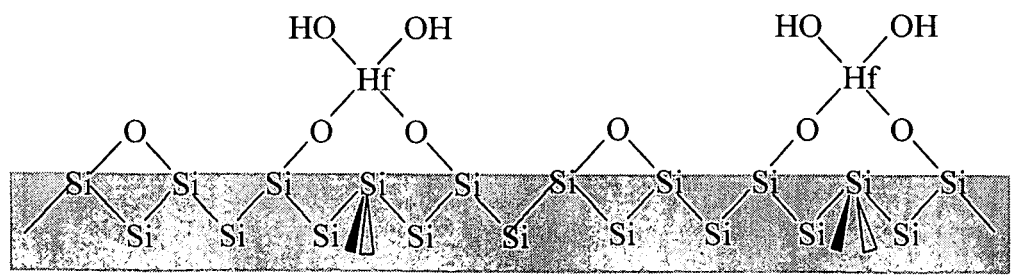

In FIG. 5A-C, possible starting surface compositions following 1-3 cycles of $HfCl_4$ and $H_2O$ are illustrated. After UV treatment (FIG. 5D) the surface coverage is increased dramatically.

Example 3

An ALD deposition is done on a silicon semiconductor substrate, starting from $HCl_4$ as first precursor and $H_2O$ as second precursor.

Between the $HCl_4$ pulse and the $H_2O$ pulse an inert atmosphere is provided by purging the reactor with nitrogen.

A nitrogen purge is also done after the $H_2O$ pulse.

A spot of about 40 mm width on the silicon substrate is then exposed to a 172 nm UV irradiation during one of the two nitrogen purges.

Figure 6:
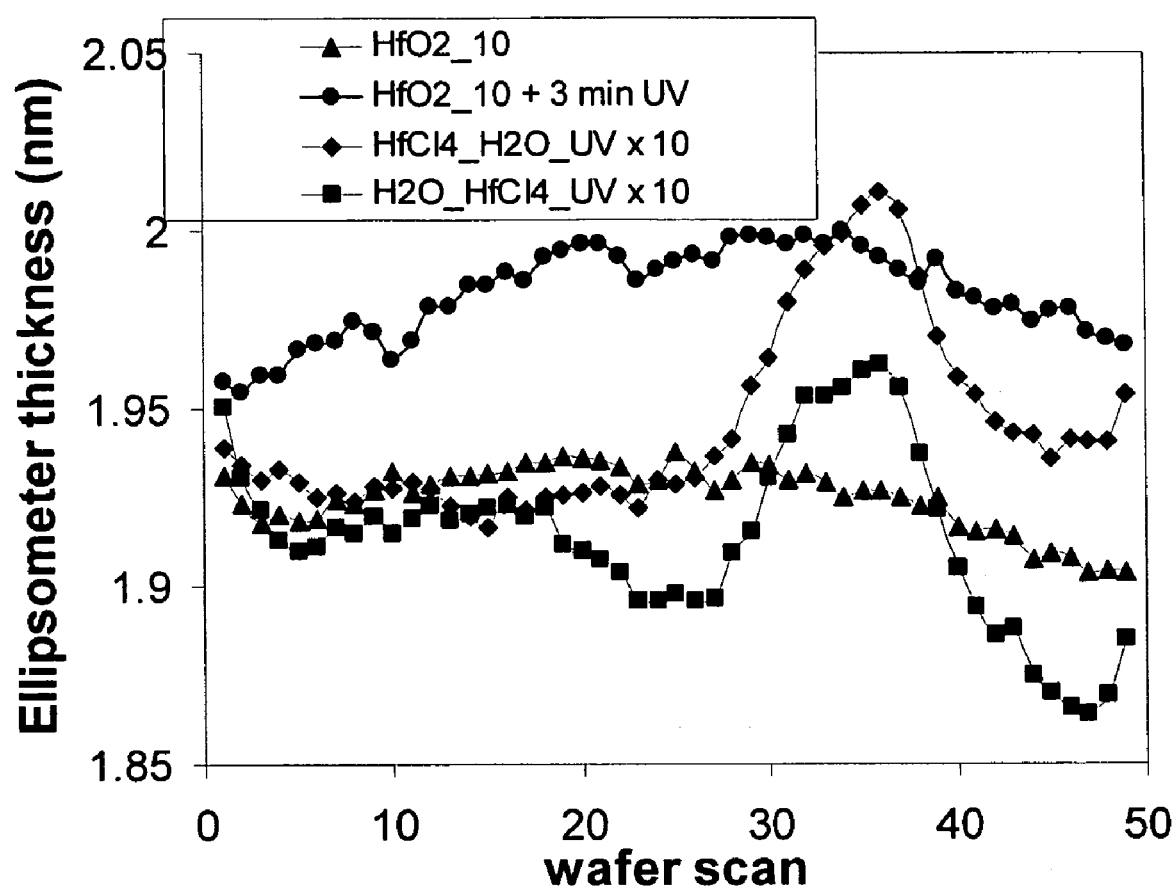
FIG. 6: Difference in layer thickness measured by ellipsometry between the substrate surface exposed to UV irradiation and the substrate surface not exposed to UV irradiation.

In FIG. 6, the difference in layer thickness measured by ellipsometry between the substrate surface exposed to UV irradiation and the substrate surface not exposed to UV irradiation is shown.

The triangles (▲) show the layer thickness after 10 cycles of conventional ALD without UV exposure.

The dots (●) show the layer thickness after 10 cycles of conventional ALD deposition, followed by 3 min UV exposure as a post-deposition treatment.

The diamonds (♦) show the layer thickness after 10 cycles of ALD including in each cycle, after the $H_2O$ pulse, an exposure to UV irradiation.

One can clearly see that the thickness is higher where the UV irradiation hit the substrate surface (between about 30 and 40 units of the wafer scan).

The squares (■) show the layer thickness after 10 cycles of ALD including in each cycle, after the $HfCl_4$ pulse, an exposure to UV irradiation.

Again, one can clearly see that the thickness is higher where the UV irradiation hit the substrate surface (between about 30 and 40 units of the wafer scan).

One can conclude that exposure to UV included in each ALD cycle results in increased layer thickness.

An exposure to UV as a post-deposition treatment shows no effect: the layer thickness is not increased where the UV irradiation hit the substrate surface.

The overall increased layer thickness in the latter case is probably caused by exposure to moisture between the ALD and the post-deposition exposure to UV.

Figure 7:
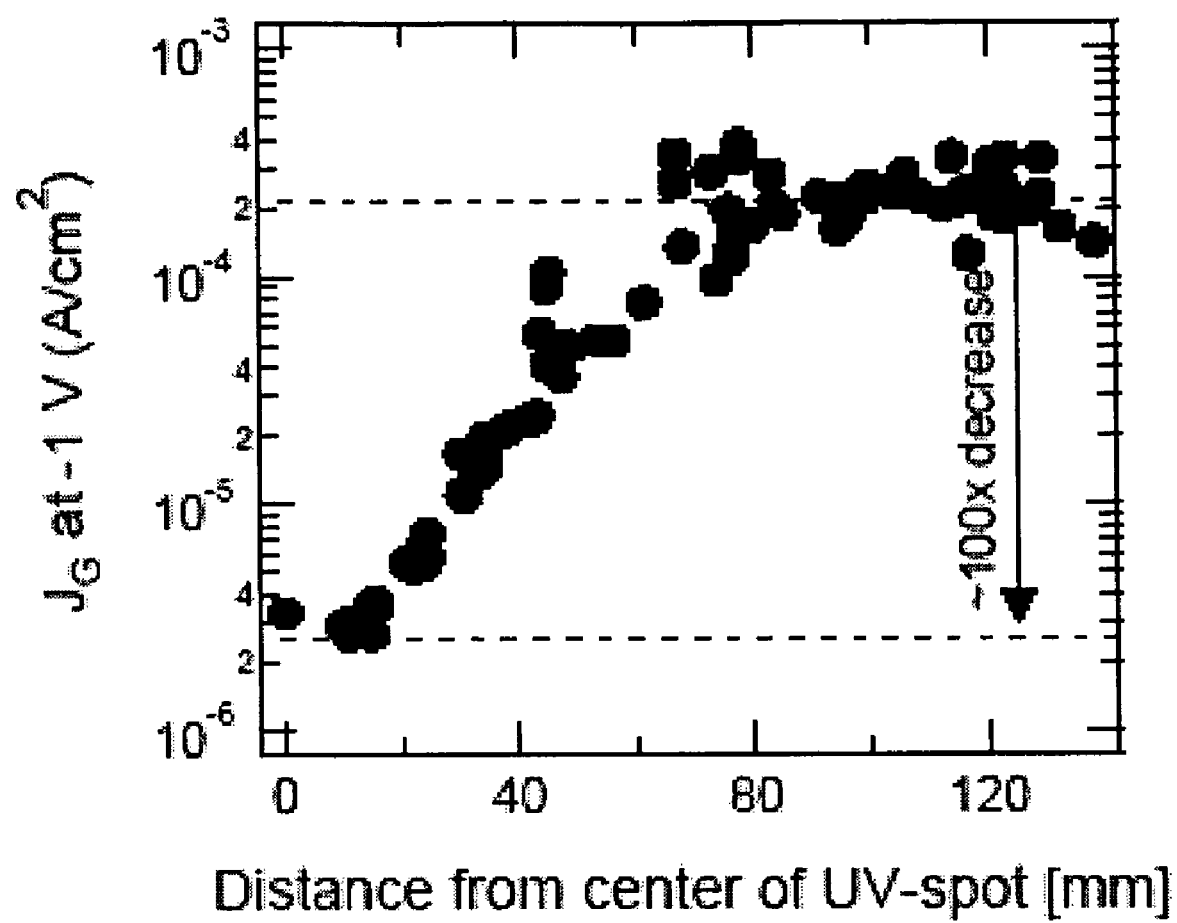
FIG. 7: Leakage current versus distance from the center of the spot on the surface exposed to UV irradiation.

FIG. 7 shows that, with decreasing distance towards the center of the spot of the surface exposed to UV, the leakage current of the $HfO_2$ is decreasing. The gradient in leakage current is probably caused by the intensity gradient of the UV radiation source.

Figure 8:
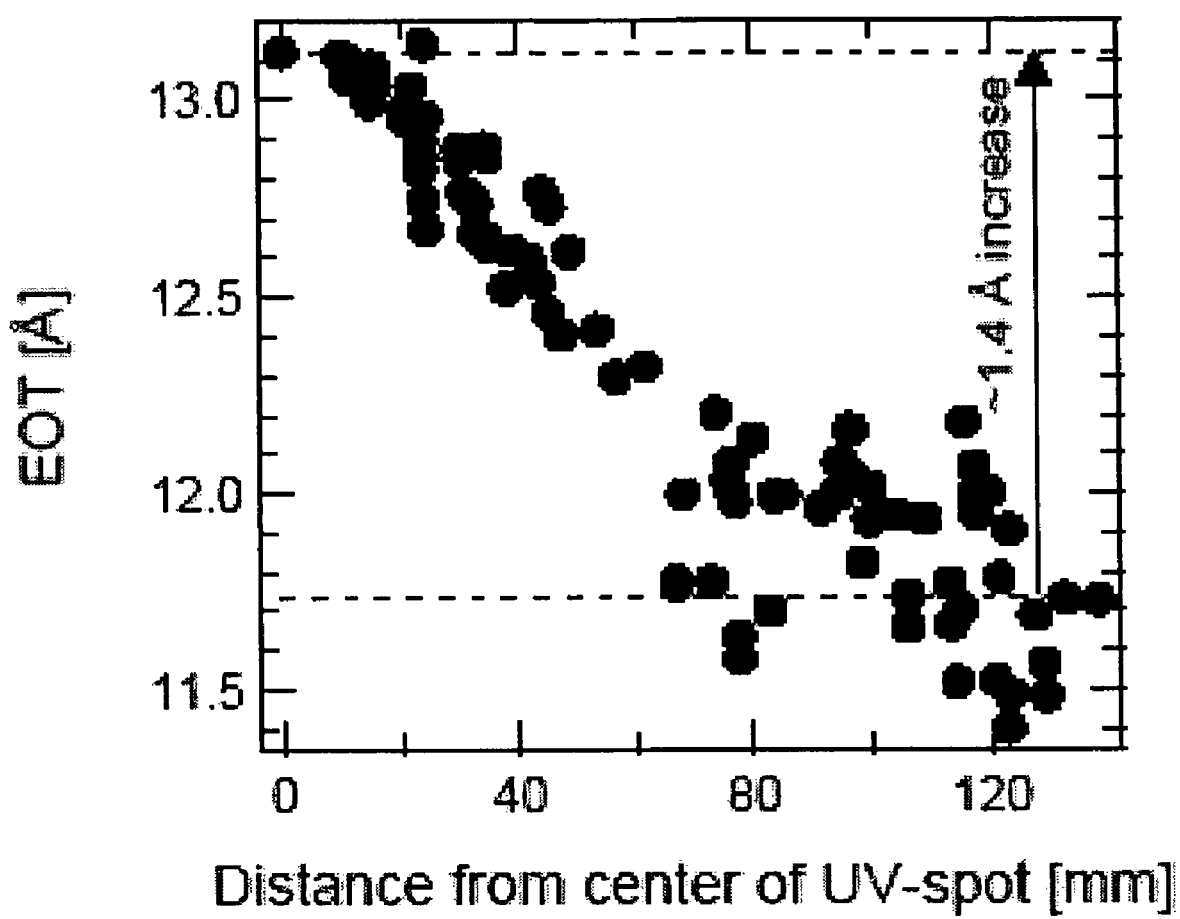
FIG. 8: EOT versus distance from the center of the spot on the surface exposed to LV irradiation.

At the same time, the Equivalent Oxide Thickness (EOT) is increasing with decreasing distance towards the center of the spot on the surface exposed to UV (FIG. 8). Again the gradient in EOT is probably caused by the intensity gradient of the UV radiation source.

From both figures, one could conclude that the quality of the ALD $HfO_2$ layer increases by exposure to UV irradiation.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. An atomic layer deposition method for depositing a layer comprising the steps of:
   a) providing a semiconductor substrate in a reactor;
   b) providing a pulse of a first precursor gas into the reactor;
   c) providing a pulse of a second precursor gas into the reactor; and
   d) providing an inert atmosphere in the reactor; and
   after completion of step a), step b), step c, and step d),
   e) repeating at least once steps of providing a pulse of a first precursor gas into the reactor; providing a pulse of a second precursor gas into the reactor; and providing an inert atmosphere in the reactor;
   wherein the semiconductor substrate is exposed to UV irradiation at least once during step d), and whereby a layer is obtained by atomic layer deposition.

2. The method according to claim 1, wherein the first precursor gas is selected from the group consisting of metal halides, metal oxyhalides, and metalorganics.

3. The method according to claim 1, wherein a trace amount of at least one of water, hydrogen peroxide, hydrogen, or any other species capable of forming hydroxyls in combination with the first precursor gas and the second precursor gas is present in the inert atmosphere.

4. The method according to claim 1, wherein the exposure to UV irradiation is stopped after 10 deposition cycles.

5. The method according to claim 1, wherein the exposure to UV irradiation is stopped after 5 deposition cycles.

6. The method according to claim 1, wherein the exposure to UV irradiation is stopped after 2 deposition cycles.

7. The method according to claim 1, wherein the exposure to UV irradiation is stopped after 1 deposition cycle.

8. The method according to claim 1, wherein the semiconductor substrate is exposed 10 times to UV irradiation.

9. The method according to claim 1, wherein the semiconductor substrate is exposed 5 times to UV irradiation.

10. The method according to claim 1, wherein the semiconductor substrate is exposed 2 times to UV irradiation.

11. The method according to claim 1, wherein the semiconductor substrate is exposed once to UV irradiation.

12. The method according to claim 1, wherein the semiconductor substrate comprises a material selected from the group consisting of silicon, silicon-on-insulator, germanium, germanium-on-insulator, and any combination thereof.

13. The method according to claim 1, wherein the first precursor gas is HfCl4, and wherein the second precursor gas is H2O.

14. The method according to claim 1, wherein the inert gas is nitrogen.

15. A semiconductor device produced by a method according to claim 1.

16. The method according to claim 1, wherein organic species are excluded from the reactor to avoid significant contamination to the layer.

17. The method according to claim 1, wherein a thickness of the layer formed is increased when compared to a method conducted without exposure of the semiconductor substrate to UV irradiation in an inert atmosphere in the reactor.

18. The method according to claim 1, comprising at least one additional step of providing an inert atmosphere in the reactor, wherein the at least one additional step is conducted between step (a) and step (b); between step (b) and step (c); or between each of step (a), step (b), and step (c).

19. The method according to claim 18, wherein the UV irradiation exposure is performed during any one of the steps of providing an inert atmosphere in the reactor.

20. The method according to claim 18, wherein the UV irradiation exposure is performed during each step of providing an inert atmosphere in the reactor.

21. The method according to claim 1, wherein the second precursor gas comprises a gas capable of forming at least one oxide or oxynitride in combination with the first precursor gas.

22. The method according to claim 21, wherein the gas capable of forming at least one oxide or oxynitride is selected from the group consisting of $H_2O$, $H_2O_2$, $O_2$, and $O_3$.

23. The method according to claim 1, wherein a wavelength of the UV irradiation is selected to provide sufficient energy to increase dissociation of the first precursor and increase formation of hydroxyls, when compared to a method conducted without exposure of the semiconductor substrate to UV irradiation.

24. The method according to claim 23, wherein the wavelength of the UV irradiation is lower than 205 nm.

25. The method according to claim 23, wherein the wavelength of the UV irradiation is lower than 195 nm.

26. The method according to claim 23, wherein the wavelength of the UV irradiation is lower than 185 nm.

27. The method according to claim 23, wherein the wavelength of the UV irradiation is lower than 175 nm.

28. The method according to claim 1, wherein the inert atmosphere is provided by purging an inert gas such as a noble gas or nitrogen.

29. The method according to claim 28, wherein the inert gas is a noble gas or nitrogen.

30. The method according to claim 1, wherein said semiconductor substrate is exposed to heat during exposure to UV irradiation.

31. The method according to claim 30, wherein the semiconductor substrate is exposed to a temperature of from about room temperature to about 350° C.

32. The method according to claim 30, wherein step b) through d) are performed at a temperature of from about 100° C. to about 250° C.

33. The method according to claim 30, wherein step b) through d) are performed at a temperature of from about 150° C. to about 220° C.

34. The method according to claim 1, further comprising repeating at least once steps of providing a pulse of a first precursor gas into the reactor; providing a pulse of a second precursor gas into the reactor; and providing an inert atmosphere in the reactor, wherein the steps are conducted before step b).

35. The method according to claim 34, wherein the UV irradiation exposure is performed during at least one of the steps of providing an inert atmosphere in the reactor conducted before step b).

36. An atomic layer deposition method for depositing a layer comprising the steps of:
   a) providing a semiconductor substrate in a reactor;
   b) providing a pulse of a first precursor gas into the reactor;
   c) providing a pulse of a second precursor gas into the reactor; and
   d) providing an inert atmosphere in the reactor after step (c) and providing an inert atmosphere in the reactor between step (a) and step (b); between step (b) and step (c); or between each of step (a), step (b), and step (c); and
   after completion of step a), step b), step c, and step d),
   e) repeating at least once steps of providing a pulse of a first precursor gas into the reactor; providing a pulse of a second precursor gas into the reactor; and providing an inert atmosphere in the reactor;
   wherein the semiconductor substrate is exposed to UV irradiation at least once during step d), and whereby a layer is obtained by atomic layer deposition, and wherein the UV irradiation exposure is performed during two or more of the steps of providing an inert atmosphere in the reactor.

37. An atomic layer deposition method for depositing a layer comprising the steps of:
   a) providing a semiconductor substrate in a reactor;
   b) providing a pulse of a first precursor gas into the reactor;
   c) providing a pulse of a second precursor gas into the reactor; and
   d) providing an inert atmosphere in the reactor; and
   after completion of step a), step b), step c, and step d),
   e) repeating at least once steps of providing a pulse of a first precursor gas into the reactor; providing a pulse of a second precursor gas into the reactor; and providing an inert atmosphere in the reactor;
   wherein the semiconductor substrate is exposed to UV irradiation at least once during step d), and whereby a layer is obtained by atomic layer deposition, and wherein the layer has an increased density at an interface between the layer and the semiconductor substrate, such that defects at the interface are reduced, thereby improving an electrical characteristic of the layer.

* * * * *

UNITED STATES PATENT AND TRADEMARK OFFICE
CERTIFICATE OF CORRECTION

PATENT NO. : 7,579,285 B2  Page 1 of 1
APPLICATION NO. : 11/484229
DATED : August 25, 2009
INVENTOR(S) : Zimmerman et al.

It is certified that error appears in the above-identified patent and that said Letters Patent is hereby corrected as shown below:

| Issued Patent | | 1. Description of Error |
|---|---|---|
| Column | Line | |
| Title Pg (Item 75) Inventors: | | Change "Leefdaal (BE);" for Paul Zimmerman to --Cader Creek, TX;--. |
| 2 | 27 | Change "organometalics)" to --organometallics)--. |
| 3 | 8 | After "150°" insert --C.--. |
| 3 | 44 (Approx.) | Change "LV" to --UV--. |
| 4 | 59 | Change "organometalics)" to --organometallics)--. |
| 8 | 44 | In Claim 1, change "c," to --c),--. |
| 9 | 14 | In Claim 13, change "HfCl4," to --HfCl$_4$,--. |
| 9 | 15 | In Claim 13, change "H2O." to --H$_2$O.--. |
| 10 | 33 | In Claim 36, change "c," to --c),--. |
| 10 | 51 | In Claim 37, change "c," to --c),--. |

Signed and Sealed this

Sixteenth Day of February, 2010

David J. Kappos
*Director of the United States Patent and Trademark Office*